United States Patent
Filippi et al.

(10) Patent No.: US 7,361,584 B2
(45) Date of Patent: Apr. 22, 2008

(54) DETECTION OF RESIDUAL LINER MATERIALS AFTER POLISHING IN DAMASCENE PROCESS

(75) Inventors: Ronald G. Filippi, Wappingers Falls, NY (US); Roy C. Iggulden, Newburgh, NY (US); Edward W. Kiewra, Verbank, NY (US); Stephen K. Loh, Fishkill, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 320 days.

(21) Appl. No.: 10/904,329

(22) Filed: Nov. 4, 2004

(65) Prior Publication Data

US 2006/0097394 A1    May 11, 2006

(51) Int. Cl.
    *H01L 21/4763* (2006.01)
(52) U.S. Cl. ..................................... 438/622
(58) Field of Classification Search ........ 257/758–760, 257/E21.579; 438/48, 622, 118, 257; 428/195.1
    See application file for complete search history.

(56) References Cited

U.S. PATENT DOCUMENTS

| | | |
|---|---|---|
| 5,667,424 A | 9/1997 | Pan |
| 5,710,069 A | 1/1998 | Farkas et al. |
| 6,110,831 A | 8/2000 | Cargo et al. |
| 6,187,417 B1 | 2/2001 | Farquhar et al. |
| 6,190,759 B1 | 2/2001 | Johansson et al. |
| 6,307,628 B1 | 10/2001 | Lu et al. |
| 6,329,118 B1 | 12/2001 | Hussein et al. |
| 6,337,375 B1 | 1/2002 | Johansson et al. |
| 6,361,923 B1 | 3/2002 | Kresge et al. |
| 6,974,766 B1* | 12/2005 | Huang ......................... 438/624 |
| 7,052,924 B2* | 5/2006 | Daniels et al. ................. 438/22 |
| 2005/0184397 A1* | 8/2005 | Gates et al. ................. 257/774 |
| 2005/0189654 A1* | 9/2005 | Kurokawa et al. .......... 257/758 |
| 2006/0097393 A1* | 5/2006 | Uchimaru et al. .......... 257/758 |
| 2006/0292860 A1* | 12/2006 | Liu et al. .................... 438/624 |

FOREIGN PATENT DOCUMENTS

EP        0468 897 B1    7/1991

* cited by examiner

*Primary Examiner*—Nathan W Ha
(74) *Attorney, Agent, or Firm*—Gibb & Rahman, LLC; Joseph Petrokaitis, Esq.

(57) ABSTRACT

A method and structure for the detection of residual liner materials after polishing in a damascene processes includes an integrated circuit comprising a substrate; a dielectric layer over the substrate; a marker layer over the dielectric layer; a liner over the marker layer and dielectric layer; and a metal layer over the liner, wherein the marker layer comprises ultraviolet detectable material, which upon excitation by an ultraviolet ray signals an absence of the metal layer and the liner over the marker layer. Moreover, the marker layer comprises a separate layer from the dielectric layer. Additionally, the ultraviolet detectable material comprises fluorescent material or phosphorescent material.

22 Claims, 6 Drawing Sheets

Ultraviolet Light

DETECTION OF RESIDUAL LINER MATERIALS AFTER POLISHING IN DAMASCENE PROCESS

BACKGROUND OF THE INVENTION

1. Field of the Invention

The embodiments of the invention generally relate to integrated circuit manufacturing, and more particularly to techniques for identifying defects in integrated circuits during manufacturing.

2. Description of the Related Art

Damascene processing typically involves the deposition of liner films between metal and insulating layers. These liner films should generally be completely removed in non-damascene areas in a subsequent chemical mechanical polishing (CMP) process. However, the CMP process typically does not adequately remove all of the liner material due to the local topography from circuit pattern factors and defects, which are both compounded by the general non-uniformity of the CMP process.

Usually, the residual liner films in between the metal layers in an integrated circuit device cannot be detected during standard inspections thereby causing metal shorting of various structures in the device, which cause significant major yield loss and reliability failure of the device. Undoubtedly, it would be quite advantageous if the residual liner films were easily detectable during a subsequent inspection process. However, typical residual films appear transparent when viewed by optical inspection. Thus, they generally cannot be detected by routine optical inspection. Therefore, there remains a need for a novel technique that allows for easier and more precise inspections of damascene structures.

SUMMARY OF THE INVENTION

In view of the foregoing, an embodiment of the invention provides an integrated circuit comprising a substrate; a dielectric layer over and adjacent to the substrate; a marker layer over and adjacent to the dielectric layer; a liner over and adjacent to the marker layer; and a metal layer over and adjacent to the liner, wherein the marker layer comprises an ultraviolet detectable material, which upon excitation by an ultraviolet ray signals an absence of the metal layer and the liner over the marker layer. Moreover, the marker layer comprises a separate layer from the dielectric layer. Additionally, the ultraviolet detectable material comprises fluorescent material or phosphorescent material.

Another embodiment of the invention provides a method of detecting whether post-CMP (chemical mechanical polishing) defects exist in an integrated circuit, wherein the method comprises depositing a dielectric layer over a substrate; forming a marker layer over the dielectric layer, wherein the marker layer comprises an ultraviolet detectable material; patterning the marker layer and the dielectric layer thereby creating exposed portions of the dielectric layer; depositing a liner over the marker layer and the exposed portions of the dielectric layer; depositing a metal layer over the liner; polishing the metal layer and the liner; and exposing the marker layer to an ultraviolet ray, wherein detection of the ultraviolet detectable material by the ultraviolet ray signals an absence of the metal layer and the liner over the marker layer. The method further comprises configuring the marker layer as a separate layer from the dielectric layer. In the step of forming, the ultraviolet detectable material comprises fluorescent material or phosphorescent material. Additionally, the method further comprises re-polishing the liner upon non-detection of the ultraviolet detectable material by the ultraviolet ray. Furthermore, the marker layer signals an endpoint for CMP processing during fabrication of the integrated circuit. The method further comprises analyzing polishing slurry effluent generated from the polishing process for a presence/absence of the ultraviolet detectable material, wherein detection/non-detection of the ultraviolet detectable material in the polishing slurry effluent signals an endpoint for CMP processing during fabrication of the integrated circuit.

Another aspect of the invention provides a method of detecting whether post-CMP (chemical mechanical polishing) defects exist in an integrated circuit, wherein the method comprises depositing a dielectric layer over a substrate; forming a marker layer comprising an ultraviolet detectable material over the dielectric layer; patterning the marker layer and the dielectric layer thereby creating exposed portions of the dielectric layer; depositing a liner over the marker layer and the exposed portions of the dielectric layer; depositing a metal layer over the liner; and polishing the metal layer and liner and the marker layer. The method further comprises exposing the dielectric layer to an ultraviolet light; and detecting whether the liner and the marker layer are present over the dielectric layer, wherein detection of the ultraviolet detectable material by the ultraviolet light signals a presence of the liner and the marker layer over the dielectric layer. Moreover, the method further comprises configuring the marker layer as a separate layer from the dielectric layer. In the step of forming, the ultraviolet detectable material comprises fluorescent material or phosphorescent material. Additionally, the method further comprises re-polishing the liner and the marker layer upon detection of the ultraviolet detectable material by the ultraviolet light; and analyzing polishing slurry effluent generated from the polishing process for a presence/absence of the ultraviolet detectable material, wherein detection/non-detection of the ultraviolet detectable material in the polishing slurry effluent signals an endpoint for CMP processing during fabrication of the integrated circuit.

The advantages afforded by the embodiments of the invention include improved process yield, performance, and reliability. Moreover, the embodiments of the invention also provide a low-cost improvement, which may reduce overall processing time by limiting the number of rework or CMP "touch-up" steps. By monitoring the CMP slurry for lack of marker material after the marker material is first detected, overpolishing of the damascene lines (which would result in higher resistance wires) can also be reduced.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
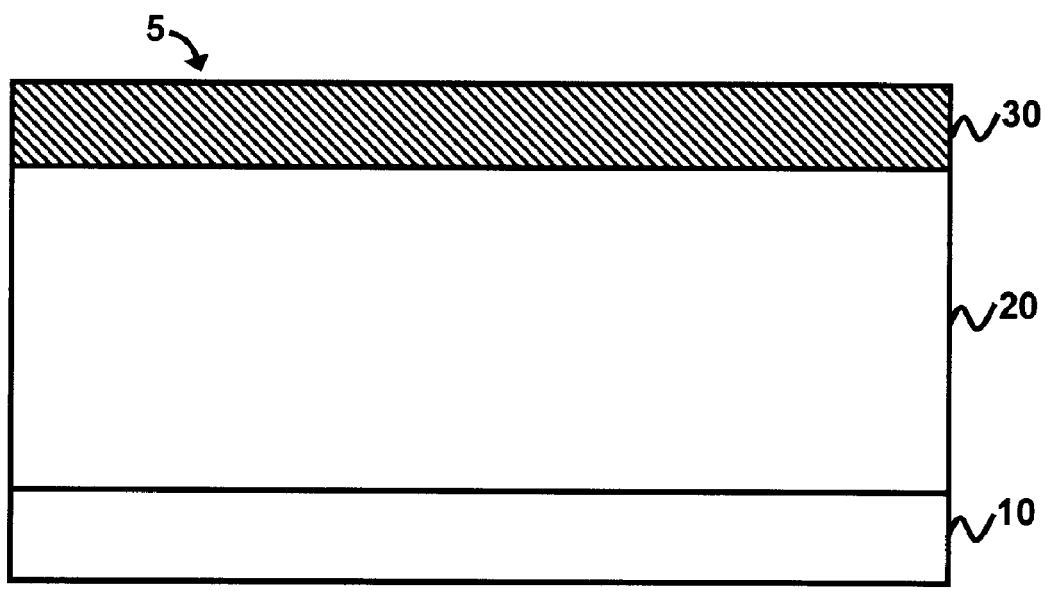
FIG. 1 is a schematic diagram of a partially completed integrated circuit according to an embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a novel technique that allows for easier and more precise inspections of damascene structures. The embodiments of the invention achieve this need by providing a layer of fluorescent or phosphorescent material into a damascene structure. The layer, which can easily be picked up under UV light and/or by slurry concentration analysis, allows for easy in situ detection of residual liner defects and/or CMP endpoint detection. Referring now to the drawings and more particularly to FIGS. 1 through 10 where similar reference characters denote corresponding features consistently throughout the figures, there are shown preferred embodiments of the invention.

FIG. 1 illustrates an integrated circuit 5 embodied as a damascene stack, which comprises a substrate 10, which may comprise a single-crystal silicon layer, or alternatively, the substrate 10 may comprise any appropriate semiconducting material, including, but not limited to silicon (Si), germanium (Ge), gallium phosphide (GaP), indium arsenide (InAs), indium phosphide (InP), silicon germanium (SiGe), gallium arsenide (GaAs), or other semiconductors. Next, an interlevel dielectric layer 20 is deposited over the substrate 10. The dielectric layer 20 may comprise silicon oxide, FTEOS (silicon oxide with fluorine impurities), Silks® (available from Dow Chemical Company, Midland, Mich., USA), SiCOH (carbon-doped oxide), and with or without a hardmask layer (not shown). Next, a marker layer 30 is deposited on top of dielectric layer 20. The marker layer 30 comprises a fluorescent or phosphorescent material, such as phosphor, which is detectable upon exposing the marker layer 30 to an ultraviolet light.

Figure 2:
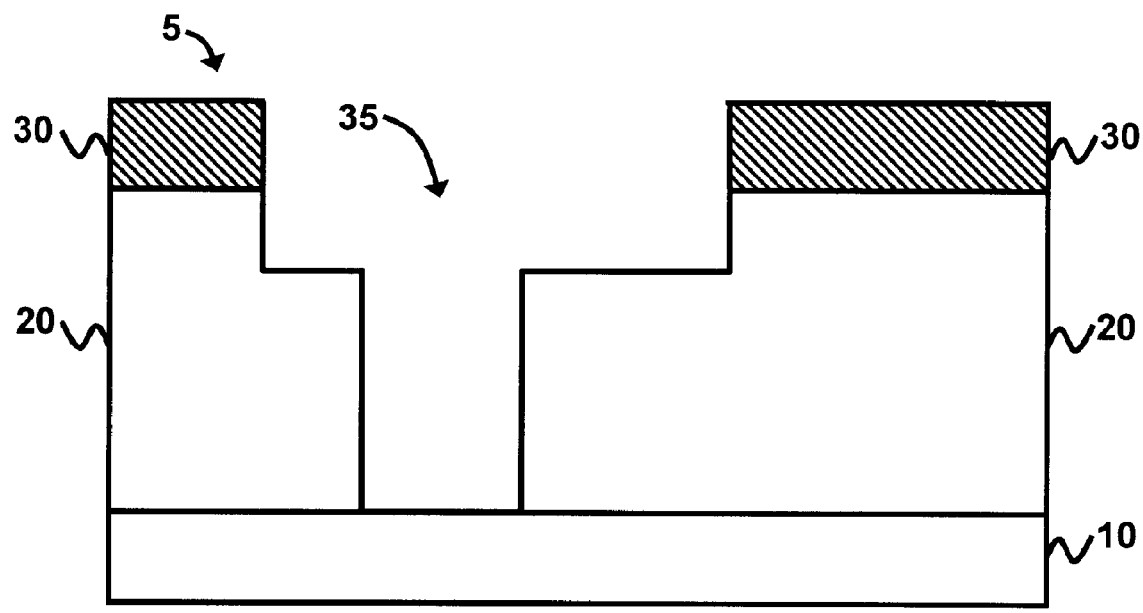
FIG. 2 is a schematic diagram of a partially completed integrated circuit following dual-damascene patterning according to an embodiment of the invention.
Figure 3:
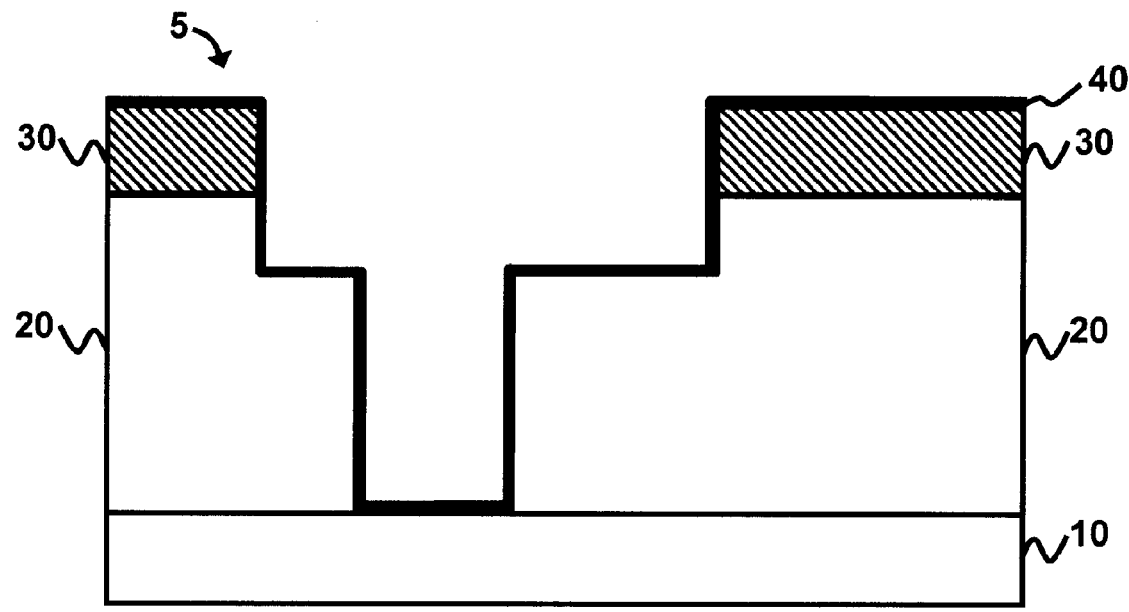
FIG. 3 is a schematic diagram of a partially completed integrated circuit following liner deposition according to an embodiment of the invention.
Figure 4:
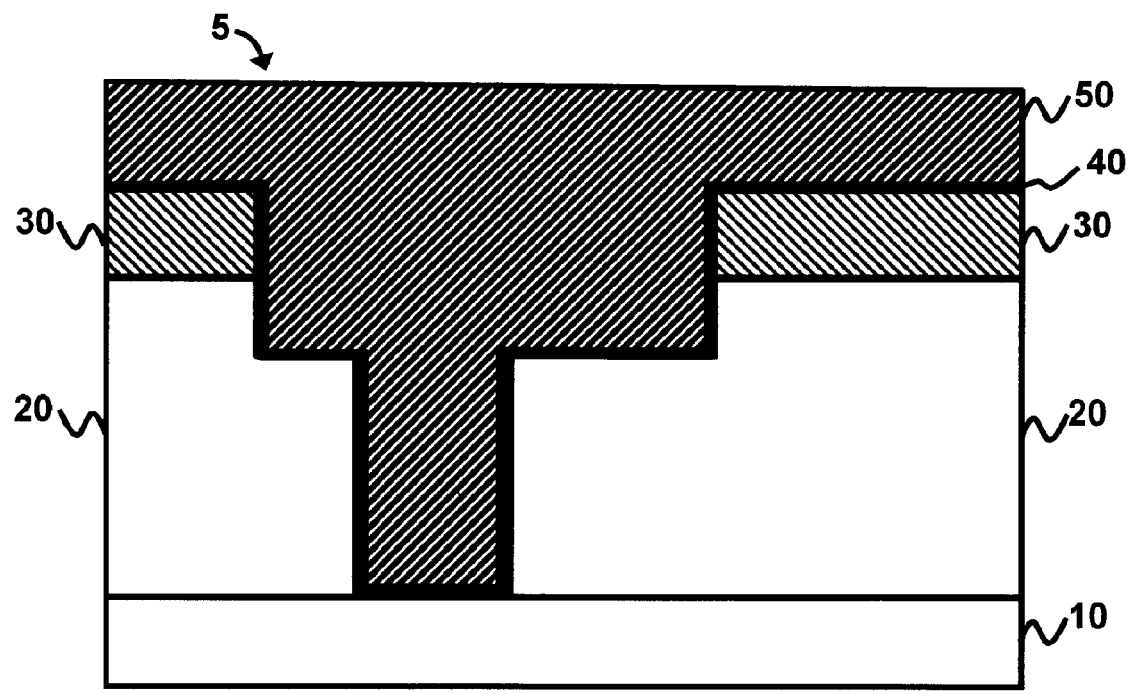
FIG. 4 is a schematic diagram of a partially completed integrated circuit following metallization deposition according to an embodiment of the invention.

Next, as shown in FIG. 2, the damascene stack 5 is patterned using any typical lithography and etching techniques known in the art, thereby creating a void 35 in the damascene stack 5. Then, as illustrated in FIGS. 3 and 4, the damascene stack 5 undergoes a metallization process, which involves the deposition of a liner 40 over all exposed surfaces of the damascene stack 5 including the exposed surfaces in the void 35. The liner film 40 may comprise tungsten (W), titanium nitride (TiN) tantalum (Ta), and tantalum nitride (TaN). Thereafter, a plating metal 50, such as copper (Cu) is deposited over the liner 40 thereby filling the void 35.

Figure 5:
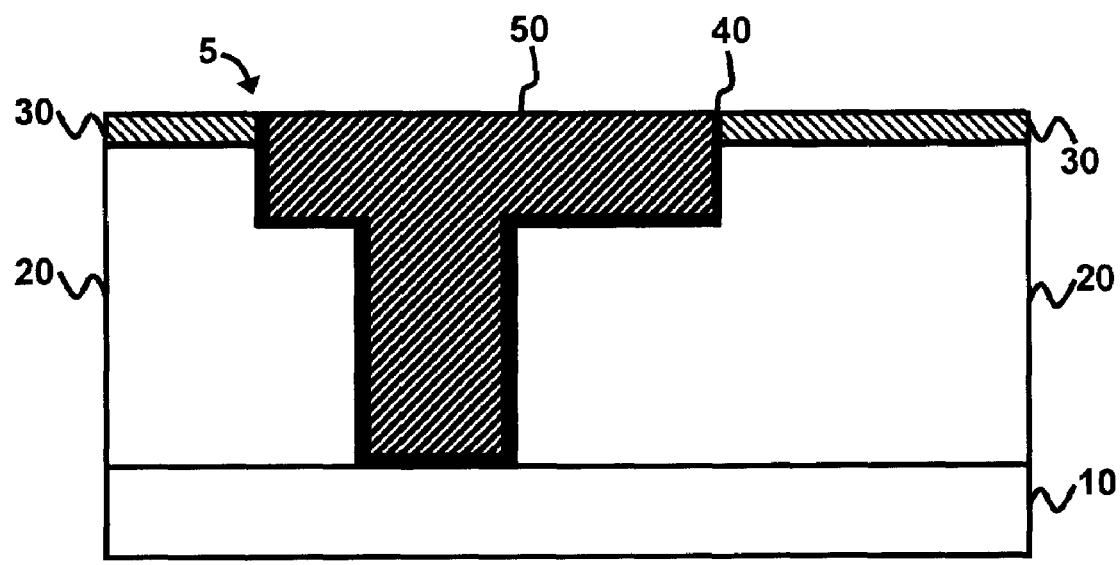
FIG. 5 is a schematic diagram of a partially completed integrated circuit following polishing according to a first embodiment of the invention.
Figure 6:
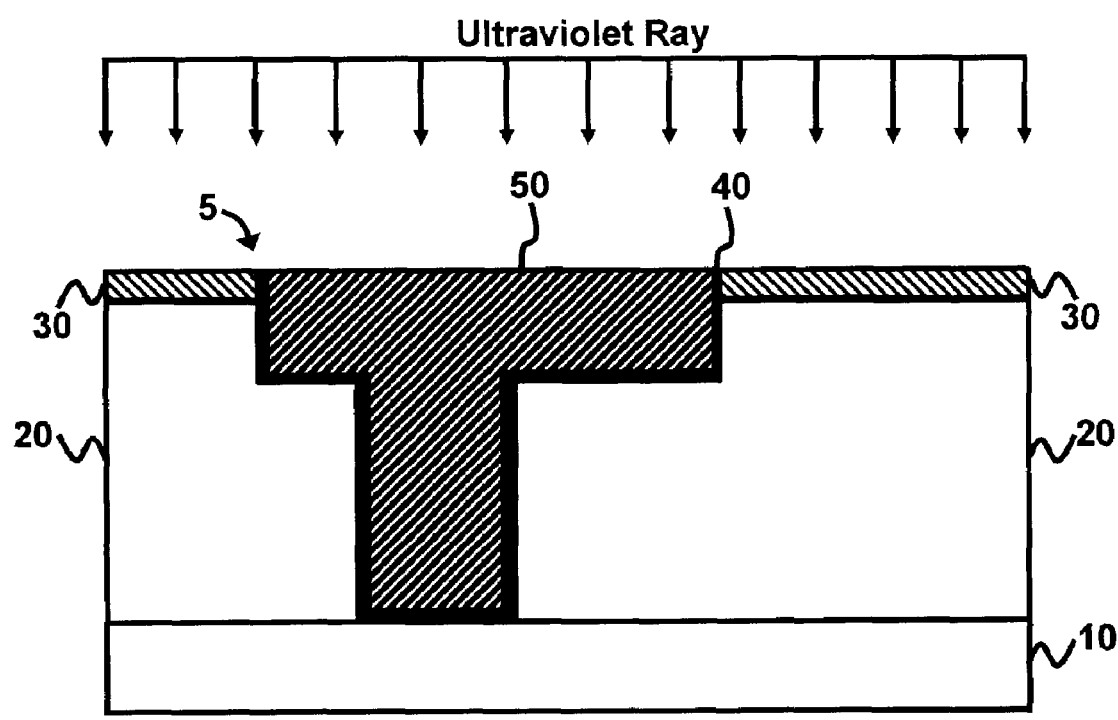
FIG. 6 is a schematic diagram of a partially completed integrated circuit being exposed to ultraviolet rays according to a first embodiment of the invention.

The next step involves performing a CMP process on the metal layer 50 and liner film 40 as shown in FIG. 5. The CMP is endpointed by using the phosphor concentration in the slurry (not shown). After endpoint, an overpolishing process is performed. Alternatively, one may endpoint when the slurry is no longer fluorescing. The overpolishing process is designed to stop on the marker layer 30. At this point, the damascene stack 5 can be quickly examined with ultraviolet light (ray) to look for fluorescence or phosphorescence in the damascene stack 5 as indicated in FIG. 6. If there are areas with no fluorescence or phosphorescence, then this indicates that there is still residual metal 50 or liner 40 (i.e., incomplete CMP) over the marker layer 30. If there remains residual metal 50 or liner 40 over the marker layer 30, then the damascene structure 5 (i.e., wafer) should be reworked with a touch up CMP process and can be re-examined. This process can continue until no residual metal 50 or liner 40 remains over the marker layer 30.

Figure 7:
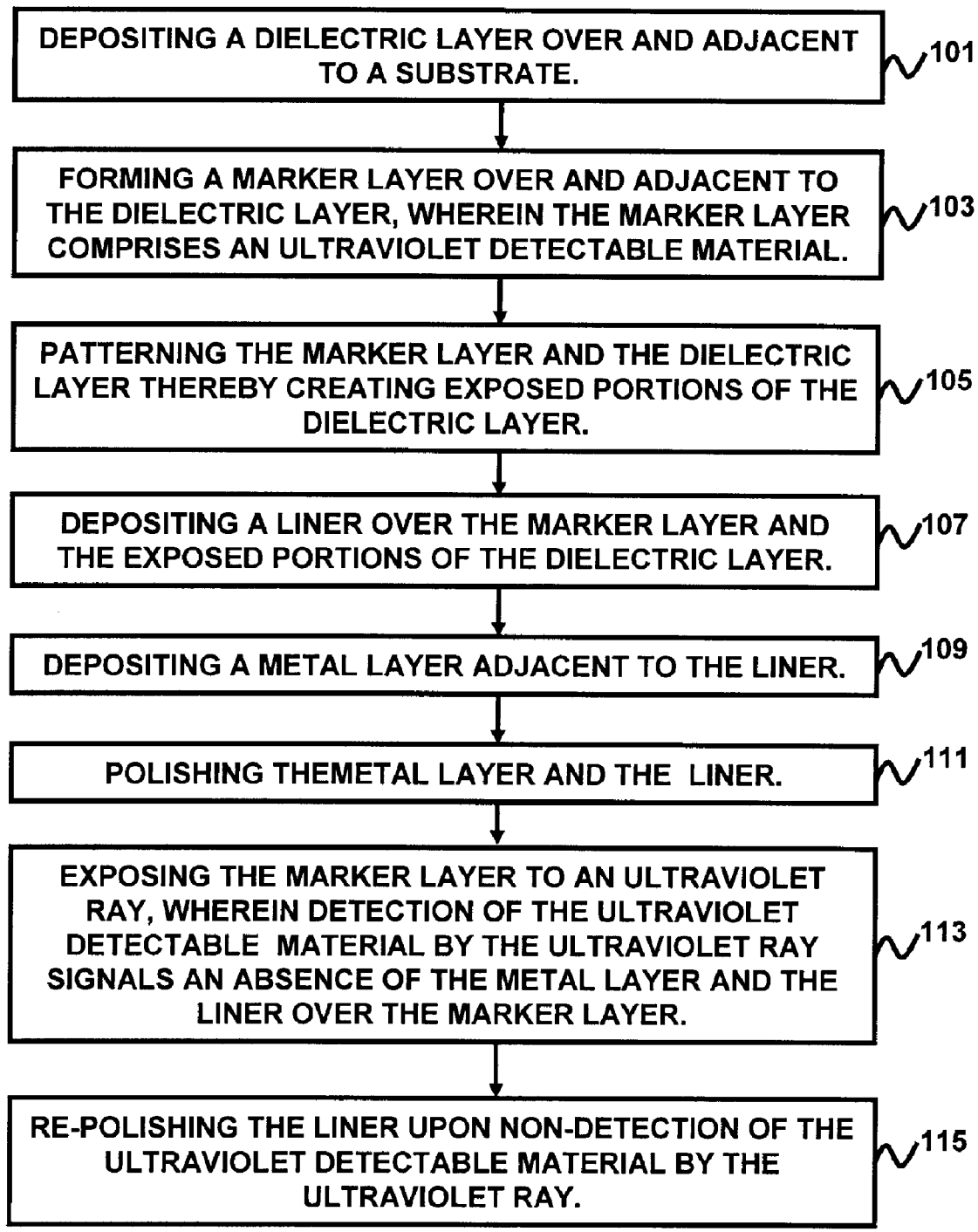
FIG. 7 is a flow diagram illustrating a preferred method according to a first embodiment of the invention.

FIG. 7 illustrates the process flow according to the first embodiment of the invention. FIG. 7 illustrates, with reference to FIGS. 1 through 6, a method of detecting whether post-CMP (chemical mechanical polishing) defects exist in an integrated circuit 5, wherein the method comprises depositing (101) a dielectric layer 20 over and adjacent to a substrate 10; forming (103) a marker layer 30 over and adjacent to the dielectric layer 20, wherein the marker layer 30 comprises an ultraviolet detectable material; patterning (105) the marker layer 30 and the dielectric layer 20 thereby creating exposed portions of the dielectric layer 20; depositing (107) a liner 40 over and adjacent to the marker layer 30 and the exposed portions of the dielectric layer 20; depositing (109) a metal layer 50 over and adjacent to the liner 40; polishing (111) the metal layer 50 and the liner 40; and exposing (113) the marker layer 30 to an ultraviolet ray, wherein detection of the ultraviolet detectable material by the ultraviolet ray signals an absence of the metal layer 50 and the liner 40 over the marker layer 30. Additionally, the method further comprises re-polishing (115) the liner 40 upon non-detection of the ultraviolet detectable material by the ultraviolet ray.

The method further comprises configuring the marker layer 30 as a separate layer from the dielectric layer 20. In the step of forming (103) the marker layer 30, the ultraviolet detectable material comprises fluorescent material or phosphorescent material. Furthermore, the marker layer 30 signals an endpoint for CMP processing during fabrication of the integrated circuit 5. The method further comprises analyzing polishing slurry effluent (not shown) generated from the polishing process (111) for a presence of the ultraviolet detectable material, wherein detection of the ultraviolet detectable material in the polishing slurry effluent signals an endpoint for CMP processing during fabrication of the integrated circuit 5. Alternatively, the method further comprises analyzing polishing slurry effluent (not shown) generated from the polishing process (111) for an absence of the ultraviolet detectable material, wherein non-detection of the ultraviolet detectable material in the polishing slurry effluent signals an endpoint for CMP processing during fabrication of the integrated circuit 5.

Figure 8:
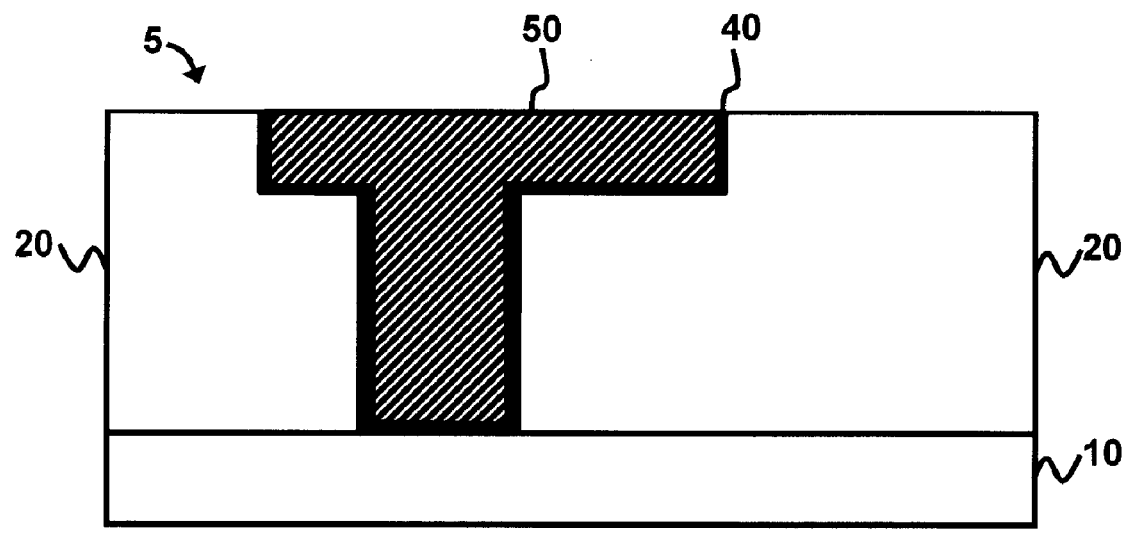
FIG. 8 is a schematic diagram of a partially completed integrated circuit following polishing according to a second embodiment of the invention.
Figure 9:
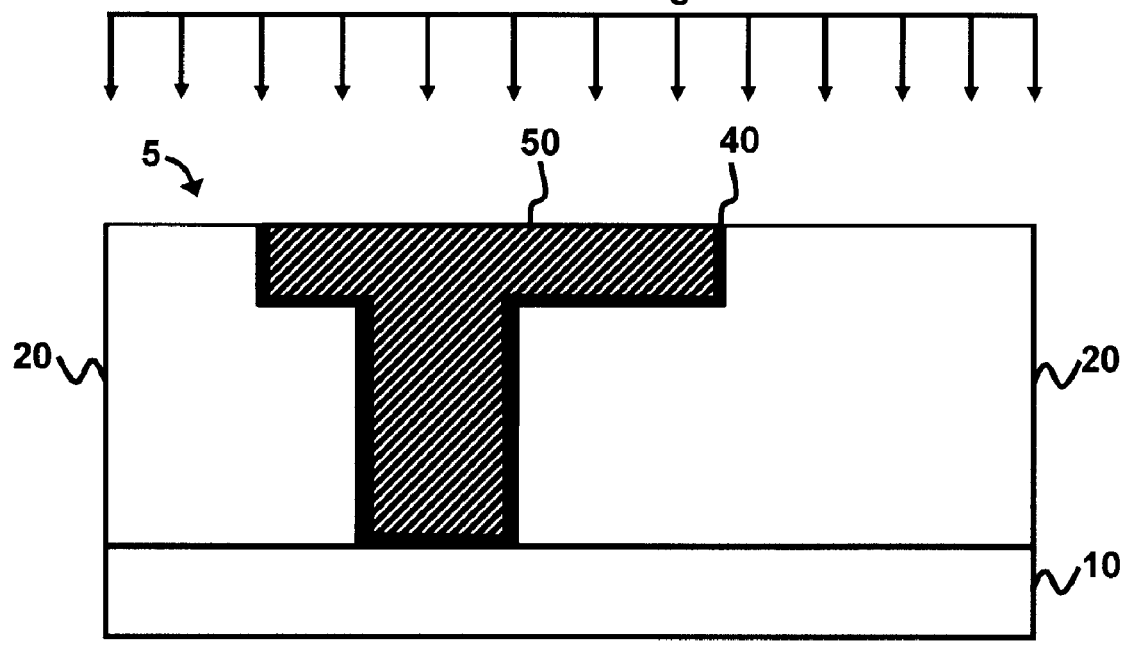
FIG. 9 is a schematic diagram of a partially completed integrated circuit being exposed to ultraviolet light according to a second embodiment of the invention.
Figure 10:
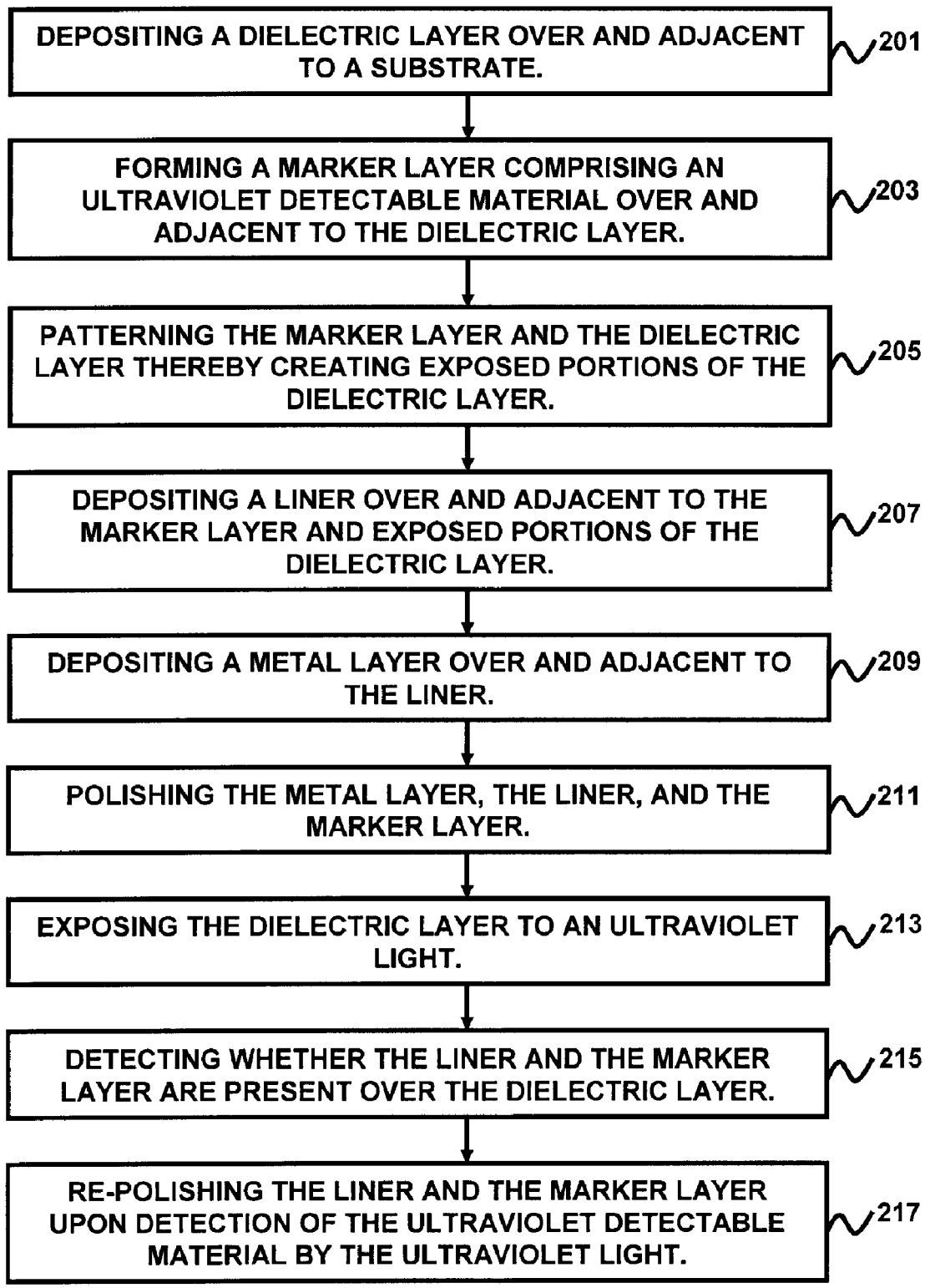
FIG. 10 is a flow diagram illustrating a preferred method according to a second embodiment of the invention.

A second embodiment of the invention is illustrated in FIGS. 8 through 10. Generally, the first and second embodiments are similar up through FIG. 4, which is the end of the metallization process. According to the second embodiment, the marker layer 30 does not act as a polishing stop layer, but instead, is polished away completely as shown in FIG. 8. The sudden presence or, alternatively, absence of phosphor in the slurry can also be used as a reference point for endpointing the process. According to the second embodiment, ultraviolet light is used to check for the presence or absence of fluorescence or phosphorescence, as illustrated in FIG. 9. Accordingly, if some of the liner 40 and marker layer 30 residuals remain after the CMP process in the area above the dielectric layer 20, then there will be a thickness variation from the areas with exposed residuals to the areas with the exposed marker layer 30 to the areas with the exposed dielectric layer 20. In other words, if fluorescence or phosphorescence is seen above the dielectric layer 20, then it is indicative of there being metal 50 or liner 40 residuals, which necessitates an additional CMP process to remove the remaining residual materials.

FIG. 10 illustrates the process flow according to the second embodiment of the invention. FIG. 10 illustrates, with reference to FIGS. 1 through 4 and FIGS. 8 and 9, a method of detecting whether post-CMP (chemical mechanical polishing) defects exist in an integrated circuit 5, wherein the method comprises depositing (201) a dielectric layer 20 over and adjacent to a substrate 10; forming (203) a marker layer 30 comprising an ultraviolet detectable material over and adjacent to the dielectric layer 20; patterning (205) the marker layer 30 and the dielectric layer 20 thereby creating exposed portions of the dielectric layer 20; depositing (207) a liner 40 over the marker layer 30; depositing (209) a metal layer 50 over and adjacent to the liner 40; and polishing (211) the metal layer 50, the liner 40, and the marker layer 30. The method further comprises exposing (213) the dielectric layer 20 to an ultraviolet light, and detecting (215) whether the liner 40 and the marker layer 30 are present over the dielectric layer 20, wherein detection of the ultraviolet detectable material by the ultraviolet light signals a presence of the liner 40 and the marker layer 30 over the dielectric layer 20. Furthermore, the method comprises re-polishing (217) the liner 40 and the marker layer 30 upon detection of the ultraviolet detectable material by the ultraviolet light.

As with the first embodiment, the method according to the second embodiment further comprises configuring the marker layer 30 as a separate layer from the dielectric layer 20. In the step of forming (203) the marker layer 30, the ultraviolet detectable material comprises fluorescent material or phosphorescent material. Additionally, the method according to the second embodiment further comprises analyzing polishing slurry effluent (not shown) generated from the polishing process for a presence or, alternatively, an absence of the ultraviolet detectable material, wherein detection or, alternatively, non-detection of the ultraviolet detectable material in the polishing slurry effluent signals an endpoint for CMP processing during fabrication of the integrated circuit 5.

The detection method provided by the embodiments of the invention is intended to determine whether metal 50 or liner 40 materials remain only over the marker layer 30. As illustrated in FIGS. 1 through 6 and 8 through 9, the liner 40 will remain in the integrated circuit 5 in areas protected by the metal layer 50, which are generally referred to as the "damascene" regions of the integrated circuit 5. It is in the "non-damascene" regions where shorting can occur if liner 40 or metal 50 remains, as such, it is in the "non-damascene" regions where the ultraviolet detection occurs.

The advantages afforded by the embodiments of the invention include improved process yield, performance, and reliability. Moreover, the embodiments of the invention also provide a low-cost improvement, which may reduce overall processing time by limiting the number of rework or CMP "touch-up" steps. By monitoring the CMP slurry for lack of marker material after the marker material is first detected, overpolishing of the damascene lines (which would result in higher resistance wires) can also be reduced.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the embodiments of the invention can be practiced with modification within the spirit and scope of the appended claims.

What is claimed is:

1. An in situ method of detecting whether post-CMP (chemical mechanical polishing) defects exist in an integrated circuit, said method comprising:
    depositing a dielectric layer over a substrate;
    forming a marker layer over said dielectric layer, wherein said marker layer comprises an ultraviolet detectable material;
    patterning said marker layer and said dielectric layer thereby creating exposed portions of said dielectric layer;
    depositing a liner over said marker layer and said exposed portions of said dielectric layer;
    depositing a metal layer over said liner;
    polishing said metal layer and said liner; and
    exposing said marker layer to an ultraviolet ray, wherein detection of said ultraviolet detectable material by said ultraviolet ray signals an absence of said metal layer and said liner over said marker layer.

2. The method of claim 1, further comprising configuring said marker layer as a separate layer from said dielectric layer.

3. The method of claim 1, wherein in said forming of said marker layer, said ultraviolet detectable material comprises fluorescent material.

4. The method of claim 1, wherein in said forming of said marker layer, said ultraviolet detectable material comprises phosphorescent material.

5. The method of claim 1, further comprising re-polishing said liner upon non-detection of said ultraviolet detectable material by said ultraviolet ray.

6. The method of claim 1, wherein said marker layer signals an endpoint for CMP processing during fabrication of said integrated circuit.

7. The method of claim 1, further comprising analyzing polishing slurry effluent generated from the polishing process for a presence of said ultraviolet detectable material, wherein detection of said ultraviolet detectable material in said polishing slurry effluent signals an endpoint for CMP processing during fabrication of said integrated circuit.

8. The method of claim 1, further comprising analyzing polishing slurry effluent generated from the polishing process for an absence of said ultraviolet detectable material, wherein non-detection of said ultraviolet detectable material in said polishing slurry effluent signals an endpoint for CMP processing during fabrication of said integrated circuit.

9. An in situ method of detecting whether post-CMP (chemical mechanical polishing) defects exist in an integrated circuit, said method comprising:
   depositing a dielectric layer over a substrate;
   forming a marker layer comprising an ultraviolet detectable material over said dielectric layer;
   patterning said marker layer and said dielectric layer thereby creating exposed portions of said dielectric layer;
   depositing a liner over said marker layer and said exposed portions of said dielectric layer;
   depositing a metal layer over said liner;
   polishing said metal layer, said liner, and said marker layer;
   exposing said dielectric layer to an ultraviolet light; and
   detecting whether said liner and said marker layer are present over said dielectric layer, wherein detection of said ultraviolet detectable material by said ultraviolet light signals a presence of said liner and said marker layer over said dielectric layer.

10. The method of claim 9, further comprising configuring said marker layer as a separate layer from said dielectric layer.

11. The method of claim 9, wherein in said forming of said marker layer, said ultraviolet detectable material comprises fluorescent material.

12. The method of claim 9, wherein in said forming of said marker layer, said ultraviolet detectable material comprises phosphorescent material.

13. The method of claim 9, further comprising re-polishing said liner and said marker layer upon detection of said ultraviolet detectable material by said ultraviolet light.

14. The method of claim 9, further comprising analyzing polishing slurry effluent generated from the polishing process for a presence of said ultraviolet detectable material, wherein detection of said ultraviolet detectable material in said polishing slurry effluent signals an endpoint for CMP processing during fabrication of said integrated circuit.

15. The method of claim 9, further comprising analyzing polishing slurry effluent generated from the polishing process for an absence of said ultraviolet detectable material, wherein non-detection of said ultraviolet detectable material in said polishing slurry effluent signals an endpoint for CMP processing during fabrication of said integrated circuit.

16. An in situ method of detecting whether post-CMP (chemical mechanical polishing) defects exist in an integrated circuit, said method comprising:
   providing an integrated circuit structure comprising a dielectric layer over a substrate;
   depositing ultraviolet detectable material over said dielectric layer;
   creating exposed portions of said dielectric layer by patterning said ultraviolet detectable material and said dielectric layer;
   forming a liner over said ultraviolet detectable material and said exposed portions of said dielectric layer;
   configuring a polished metal layer over said liner, wherein the configuring process comprises polishing said liner; and
   exposing said ultraviolet detectable material to an ultraviolet ray, wherein detection of said ultraviolet detectable material by said ultraviolet ray signals an absence of said metal layer and said liner over said ultraviolet detectable material.

17. The method of claim 16, further comprising configuring said ultraviolet detectable material as a separate layer from said dielectric layer.

18. The method of claim 16, wherein in the depositing process, said ultraviolet detectable material comprises any of fluorescent material and phosphorescent material.

19. The method of claim 16, further comprising re-polishing said liner upon non-detection of said ultraviolet detectable material by said ultraviolet ray.

20. The method of claim 16, wherein said ultraviolet detectable material signals an endpoint for CMP processing during fabrication of said integrated circuit.

21. The method of claim 16, further comprising analyzing polishing slurry effluent generated from the configuring process for a presence of said ultraviolet detectable material, wherein detection of said ultraviolet detectable material in said polishing slurry effluent signals an endpoint for CMP processing during fabrication of said integrated circuit.

22. The method of claim 16, further comprising analyzing polishing slurry effluent generated from the configuring process for an absence of said ultraviolet detectable material, wherein non-detection of said ultraviolet detectable material in said polishing slurry effluent signals an endpoint for CMP processing during fabrication of said integrated circuit.

* * * * *